(12) United States Patent
Inui

(10) Patent No.: US 7,241,166 B2
(45) Date of Patent: Jul. 10, 2007

(54) ELECTRIC EQUIPMENT

(75) Inventor: Akira Inui, Kyoto (JP)

(73) Assignee: Nidec Corporation, Kyoto (JP)

( * ) Notice: Subject to any disclaimer, the term of this patent is extended or adjusted under 35 U.S.C. 154(b) by 157 days.

(21) Appl. No.: 11/193,627

(22) Filed: Aug. 1, 2005

(65) Prior Publication Data

US 2006/0057870 A1    Mar. 16, 2006

(30) Foreign Application Priority Data

Jul. 30, 2004 (JP) ............... 2004-224935

(51) Int. Cl.
*H01R 12/24* (2006.01)
(52) U.S. Cl. .................. 439/495; 439/377; 439/64; 439/329
(58) Field of Classification Search ............... 439/327, 439/329, 492, 495, 498, 499, 496, 497, 493, 439/374, 377, 64
See application file for complete search history.

(56) References Cited

U.S. PATENT DOCUMENTS

| | | | | |
|---|---|---|---|---|
| 4,890,381 A * | 1/1990 | Dubois et al. | ................ | 29/832 |
| 6,000,951 A * | 12/1999 | Hansen et al. | ................ | 439/67 |
| 6,077,088 A * | 6/2000 | Yu et al. | ................ | 439/64 |
| 6,305,971 B1 * | 10/2001 | Yu-Feng | ................ | 439/493 |
| 6,361,350 B2 * | 3/2002 | Johnson et al. | ................ | 439/374 |
| 6,386,905 B1 * | 5/2002 | Ito | ................ | 439/495 |
| 6,439,919 B1 * | 8/2002 | Yasufuku et al. | ................ | 439/377 |
| 7,029,320 B2 * | 4/2006 | Maejima | ................ | 439/495 |
| 7,083,454 B2 * | 8/2006 | Suzuki | ................ | 439/260 |
| 2003/0022547 A1 * | 1/2003 | Sukagawa | ................ | 439/374 |
| 2003/0092310 A1 * | 5/2003 | Kunishi et al. | ................ | 439/495 |
| 2004/0067679 A1 * | 4/2004 | Maejima | ................ | 439/495 |
| 2004/0110412 A1 * | 6/2004 | Ueda | ................ | 439/495 |
| 2006/0030206 A1 * | 2/2006 | Zhang et al. | ................ | 439/495 |
| 2006/0105621 A1 * | 5/2006 | Zhang et al. | ................ | 439/495 |
| 2006/0110974 A1 * | 5/2006 | Suzuki et al. | ................ | 439/495 |
| 2006/0128207 A1 * | 6/2006 | Zhang et al. | ................ | 439/495 |
| 2006/0172590 A1 * | 8/2006 | Yamada et al. | ................ | 439/495 |
| 2006/0270270 A1 * | 11/2006 | Yokoyama | ................ | 439/495 |
| 2007/0010126 A1 * | 1/2007 | Kim | ................ | 439/495 |

FOREIGN PATENT DOCUMENTS

JP    2001-143785    5/2001

* cited by examiner

*Primary Examiner*—Ross Gushi
(74) *Attorney, Agent, or Firm*—Westerman, Hattori, Daniels & Adrian, LLP

(57) ABSTRACT

In order to prevent any erroneous insertion of a thin circuit board 3 into a gap 5 formed between a main circuit board 1 and a connector 2 when the thin circuit board 3 is inserted into an inserting port 2e formed at the connector 2 fixed at a mounting surface of the main circuit board 1 by electric connection, a guide 6 is formed by applying solder onto the mounting surface of the main circuit board 1 and in the vicinity of the inserting port 2e. The guide 6 can prevent any insertion of the thin circuit board 3 into the gap 5.

6 Claims, 4 Drawing Sheets

ELECTRIC EQUIPMENT

FIELD OF THE INVENTION

The invention relates to electric equipment, in which electric connection is achieved by inserting a thin circuit board into a connector fixed onto and electrically connected to a main circuit board.

BACKGROUND OF THE INVENTION

In electric equipment such as audio equipment, video equipment, a computer and peripheral equipment thereof, functional equipment such as a motor, an actuator or an input/output device is connected to a main circuit board, on which a circuit having a function as a control circuit is mounted. There has been conventionally known a structure for connecting a thin circuit board having flexibility to a connector as a structure for connecting the functional equipment connected onto the main circuit board to a power source. Here, the connector is formed into a shape of a casing, which contains therein a plurality of terminals electrically connected and fixed to the main circuit board by soldering and whose one surface has an inserting port thereat. Moreover, a flexible printed circuit board (hereinafter abbreviated as "an FPC") and a flexible flat cable (hereinafter abbreviated as "an FFC") have been well known as the thin circuit board for use in connection to the connector.

In recent years, the connector, the FPC and the FFC also have become thinner in association with the miniaturization of the electric equipment. In the meantime, since the connector has been merely mounted on the main circuit board by soldering the terminal, a slight gap has been formed between the connector and the main circuit board.

FIG. 4 is a view schematically showing a structure for inserting an FPC into a connector in the prior art.

An FPC 300 is thin and has flexibility. Therefore, a worker intends to insert the FPC 300 into a connector 200 while holding the vicinity of a tip of the FPC 300 during an inserting work of the FPC 300 into the connector 200 by the worker. However, the worker cannot hold a connector joint 310 of the FPC 300, which is a portion to be inserted into the connector 200. Consequently, the tip of the connector joint 310 of the FPC 300 is flexed, and cannot be properly positioned. As a result, the worker cannot accurately insert the FPC 300 into a connector inserting port 210. As countermeasures against this, a guide surface 220 is formed at the connector inserting port 210, such that the FPC 300 can be favorably inserted into the connector inserting port 210 at a substantially proper position. Nevertheless, the FPC 300 may be flexed downward of the guide surface 220, and as a result, may be erroneously inserted into a gap 500. In this case, the worker must do the inserting work of the FPC 300 again, thereby raising a problem of degradation of productivity by the worker. In addition, in the case where the FPC 300 is erroneously inserted into the gap 500, the FPC 300 has been caught in the connector 200 when the FPC 300 is inserted into and drawn back from the gap 500, whereby the FPC is scratched. As a result, the FPC 300 becomes a defective product, thereby raising a problem of an impossibility of reuse of the FPC 300.

As countermeasures against the above-described erroneous insertion, there has been a method for preventing any erroneous insertion by constituting a connector of a plurality of members and forming a cutout at an FPC in the prior art. In this case, since a special part for preventing any erroneous insertion of the FPC must be mounted on the connector, the number of parts has been increased. To make matters worse, the shape of the connector must be varied, and therefore, a versatile connector cannot be used. This leads an increase in unit cost of the connector. Additionally, since the FPC corresponding to the connector also must be made into special shape in a similar manner, a versatile FPC cannot be used. This leads to an increase in unit cost of the FPC.

SUMMARY OF THE INVENTION

The invention can provide a structure for preventing a thin circuit board such as an FPC or the like from being erroneously inserted into a gap formed between a connector and a main circuit board by a worker with a simple structure which cannot exert a special load on the worker.

Electric equipment in one example according to the invention encompasses a configuration in which a connector is mounted on either one face as a mounting surface of a main circuit board and an FPC is inserted into the connector.

In the connector, the FPC can be inserted on one side substantially in parallel to the main circuit board, and the connector has an inserting port extending substantially in parallel to the main circuit board.

Moreover, a guide is formed in the vicinity of the connector on the mounting surface. The guide is positioned so that it contacts to the thin circuit board by its top when the thin circuit board is inserted into the inserting port. The top of the guide protrudes from the mounting surface. The protrusion prevents the thin circuit board from being erroneously inserted into the gap between the connector and the thin circuit board, which is often formed without intention in the production processes. The height of the protrusion measured from the mounting surface is set not to exceed the height of the inserting port. Therefore, the guide is not an obstacle to insertion. In addition, a height obtained by adding the thickness of the guide and the thickness of a thin circuit board is greater than a gap formed between either surface of the main circuit board and the connector.

The guide is formed by applying one or more materials selected from solder, a resin and a coating material. Otherwise, an adhesive or a resin agent may be filled into the gap.

With the electronic equipment according to the invention, it is possible to prevent the thin circuit board from being inserted into the gap by the effect of the guide formed on the main circuit board. As a result, the thin circuit board can be favorably connected to the inserting port of the connector.

Furthermore, with the electronic equipment according to the invention, it is possible to form the guide by applying one or more materials selected from the solder, the resin and the coating material or filling the adhesive agent or the resin into the gap. As a result, the electric equipment can be formed with a simple structure by an easy method. Thus, the productivity by a worker can be enhanced in mass production.

DETAILED DESCRIPTION OF THE PREFERRED EMBODIMENTS

Figure 1:
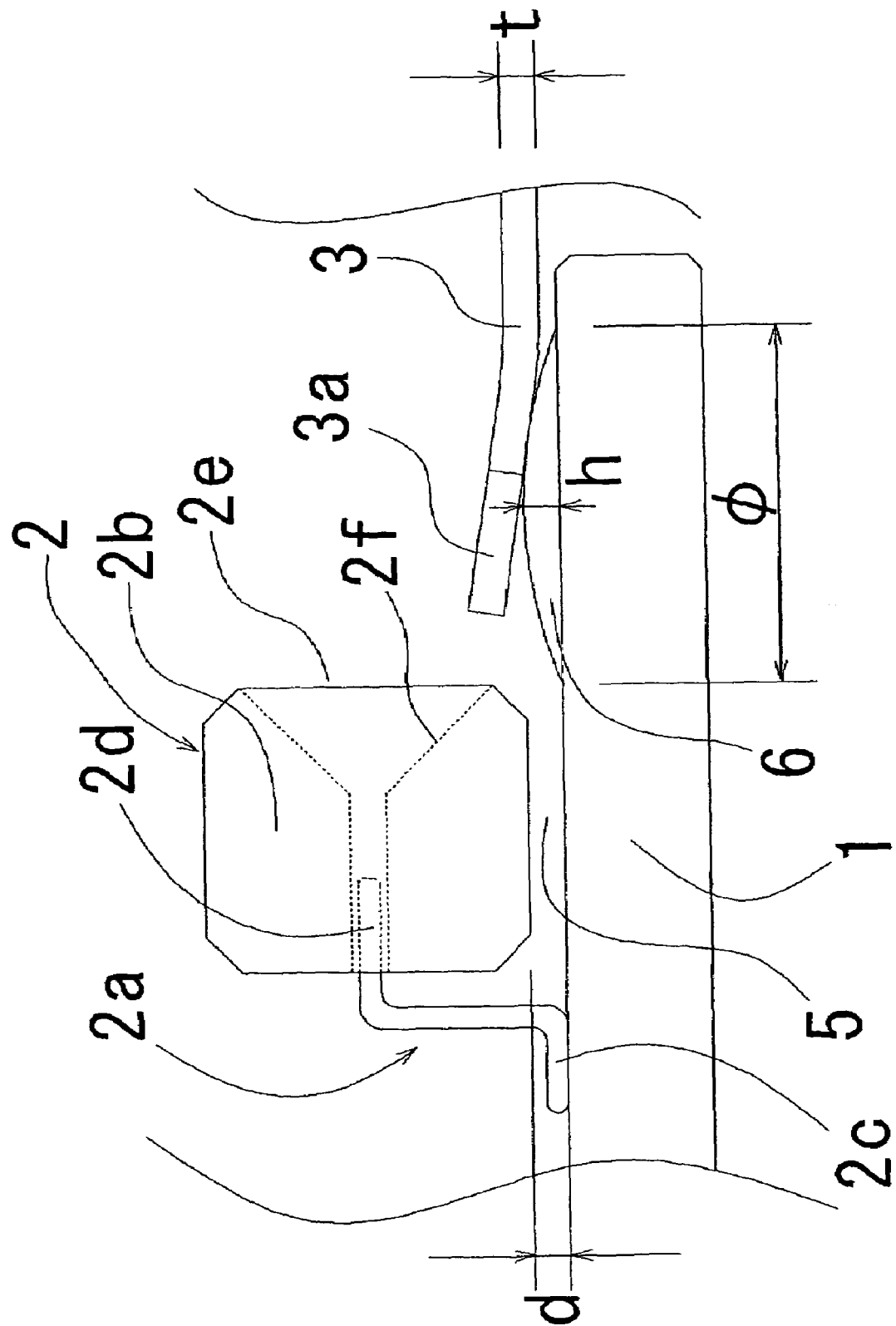
FIG. 1 is a view schematically showing a first preferred embodiment according to the invention.

A description will be given below of preferred embodiments according to the invention in reference to FIGS. 1 to 3. In the case where terms indicating directions such as vertical, lateral and lengthwise directions are used in the description relative to the invention, they designate directions in the drawings, and therefore, a direction in carrying out the invention cannot be limited. A dotted line in the drawings indicates the inside of a member.

First Preferred Embodiment

FIG. 1 is a view schematically showing a first preferred embodiment according to the invention.

Referring to FIG. 1, a connector 2 is fixed onto a side of a mounting surface (i.e., on an upper side in FIG. 1) of a main circuit board 1 formed by molding paper phenol or the like into a flat plate. The connector 2 is constituted of a terminal 2a and an outside connected portion 2b, which contains a part of the terminal 2a and is molded of an insulating casing made of a resin or the like. The terminal 2a further includes a main circuit board connecting portion 2c, which is not contained inside of the casing and is electrically connected to the main circuit board 1 by soldering, and a thin circuit board connecting portion 2d, which is contained inside of the casing and performs electric connection in contact with an FPC 3 serving as a thin circuit board, described later. At the outside connected portion 2b, an opening is formed as an inserting port 2e with respect to an outside terminal at one of surfaces formed perpendicularly to the main circuit board 1. Inside of the inserting port 2e is formed a guide surface 2f, at which the FPC 3 is favorably connected to the thin circuit board connecting portion 2d of the terminal 2a by vertically narrowing a clearance of the inserting port 2e. The FPC 3 is inserted on an opening side of the inserting port 2d. At the tip of the FPC 3 is formed a conductive inserting portion 3a. The thin circuit board connecting portion 2d of the terminal 2a and the inserting portion 3a of the FPC 3 are securely brought into contact with each other by inserting the thin circuit board 3 into the connector 2, thereby achieving electric connection.

In the present preferred embodiment, an FPC having a thickness t of 0.12 mm is used as the FPC 3. In addition, a width d of a gap 5 formed between the connector 2 and the main circuit board ranges from about 0.08 mm to about 0.15 mm in the case of a versatile product used in the present preferred embodiment. The gap 5 is inevitably formed in accordance with the thickness of the solder or the fabrication tolerance of the connector 2 at the time of mounting.

In the present preferred embodiment, a projecting guide 6 for guiding the FPC 3 into the inserting port 2e formed at the connector 2 is formed on the main circuit board 1 rightward of the connector 2 in order to prevent any intrusion of the FPC 3 into the gap 5. The guide 6 is a so-called land formed by applying solder thereto. The guide 6 is formed into a circular shape as viewed from the top. The diameter φ of the guide 6 is 1.0 mm. Furthermore, the height h of the guide 6 is equal to or greater than the thickness t of the FPC 3 in the present preferred embodiment, although it largely depends upon a solder applying process. As a result, the guide 6 serves as a guide of the FPC 3 to the connector inserting port in inserting the FPC 3, and therefore, the FPC 3 cannot be inserted into the gap 5, thereby achieving excellent connection.

Deficient connector insertion of the FPC 3 can be remarkably reduced by carrying out the present preferred embodiment according to the invention in comparison with in the prior art. Moreover, a worker need not keep tension all the time in order to prevent any intrusion of the FPC 3 into the gap 5. As a result, a load exerted on the worker can be remarkably alleviated.

Incidentally, the guide 6 may be formed with the application of a resin by welding. Additionally, the guide 6 need not be formed over the entire gap 5, but it is enough to form the guide 6 at least at both ends of the connector 2.

Second Preferred Embodiment

Figure 2:
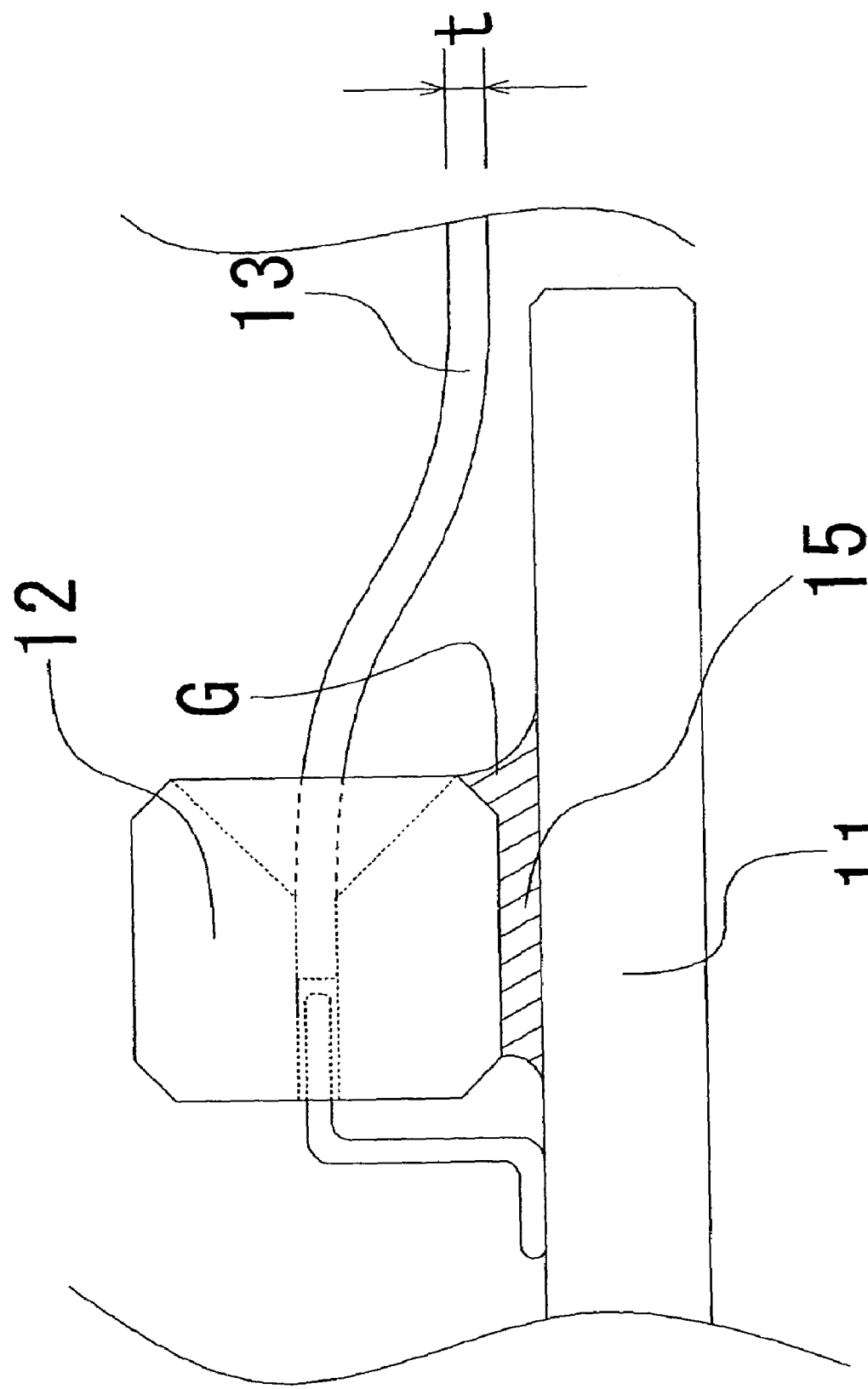
FIG. 2 is a view schematically showing a second preferred embodiment according to the invention.

FIG. 2 is a view schematically showing a second preferred embodiment according to the invention.

Referring to FIG. 2, a connector 12 is adhesively fixed onto a main circuit board 11, and a thin circuit board 13 is inserted into the connector 12. The thin circuit board 13 in the present preferred embodiment is the same as the thin circuit board 3 in the first preferred embodiment, and therefore, it will be hereinafter referred to as "an FPC 13".

In the present preferred embodiment, a gap 15 is formed between the connector 12 and the main circuit board 11, and a right portion, that is, a portion of the gap 15 suspended from an inserting port 12d of the connector 12 is filled with an adhesive agent G. As a result, the FPC 13 can be prevented from intruding into the gap 15 in the present preferred embodiment.

Here, in the case where the adhesive agent is used, it is necessary to sufficiently examine the materials of the main circuit board 11 and the connector 12 and the material of the adhesive agent G. Moreover, in the case of the use of the adhesive agent G, an attention need be paid to the following points: there is a fear of degradation of an insulating property or a coating property of the main circuit board 11 due to the material of the adhesive agent G; there is a fear of an adverse influence on connection at a contact point; it takes time for hardening the adhesive agent G, thereby deteriorating workability in turn; and there is a fear of an adverse influence by gas generated and released when the adhesive agent G is hardened, although a very high cleanness may be required in environment in which electronic equipment is fabricated.

However, the use of the adhesive agent G in electronic equipment to be used in general environment can prevent any erroneous insertion of the FPC 13 only by filling the adhesive agent G in the gap 15 in the same manner as in the first preferred embodiment, thus enhancing the productivity by the worker with very ease at a reduced cost. In this case, a resin may be use in place of the adhesive agent.

Third Preferred Embodiment

Figure 3:
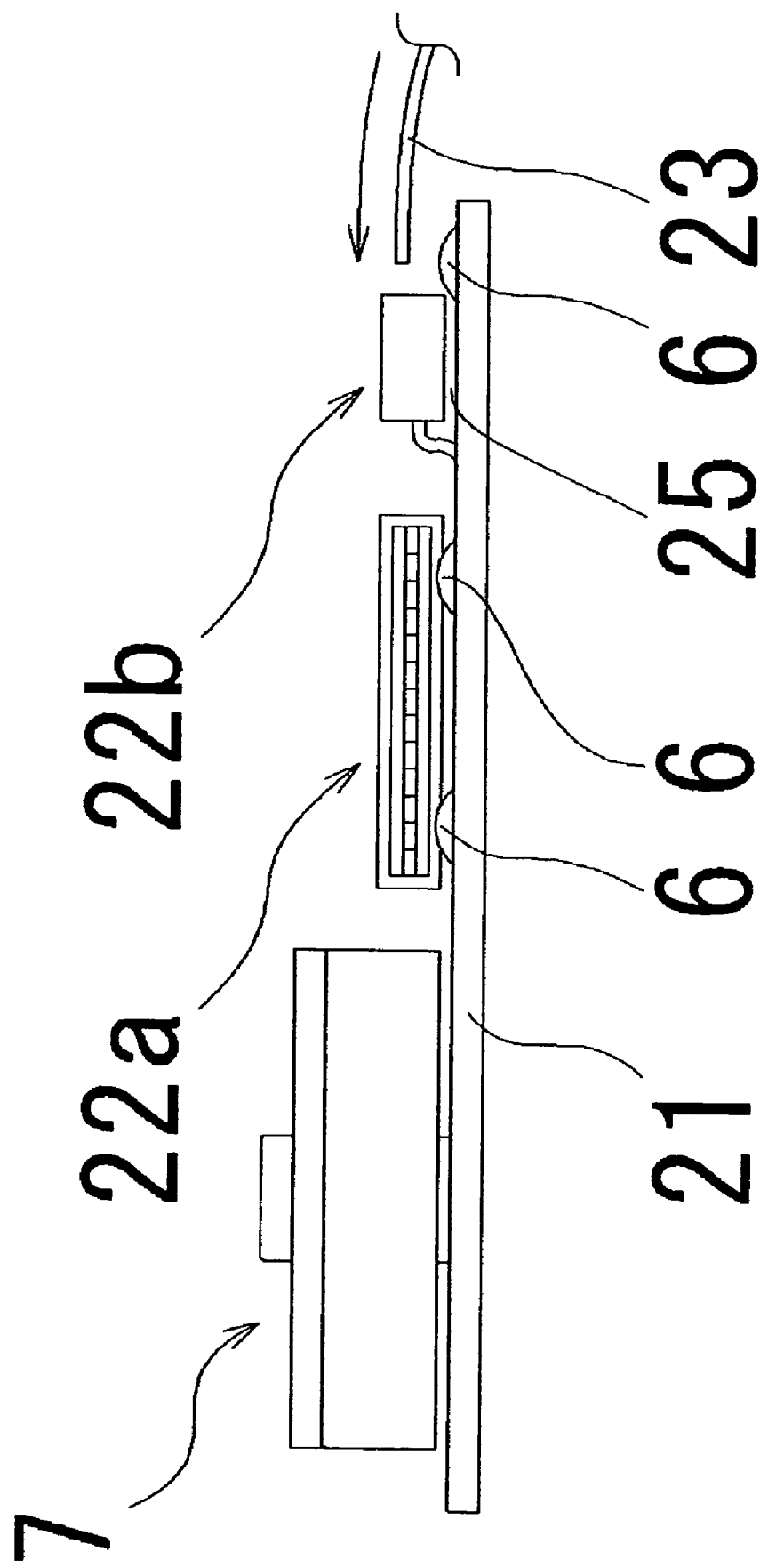
FIG. 3 is a view schematically showing a third preferred embodiment according to the invention.
Figure 4:
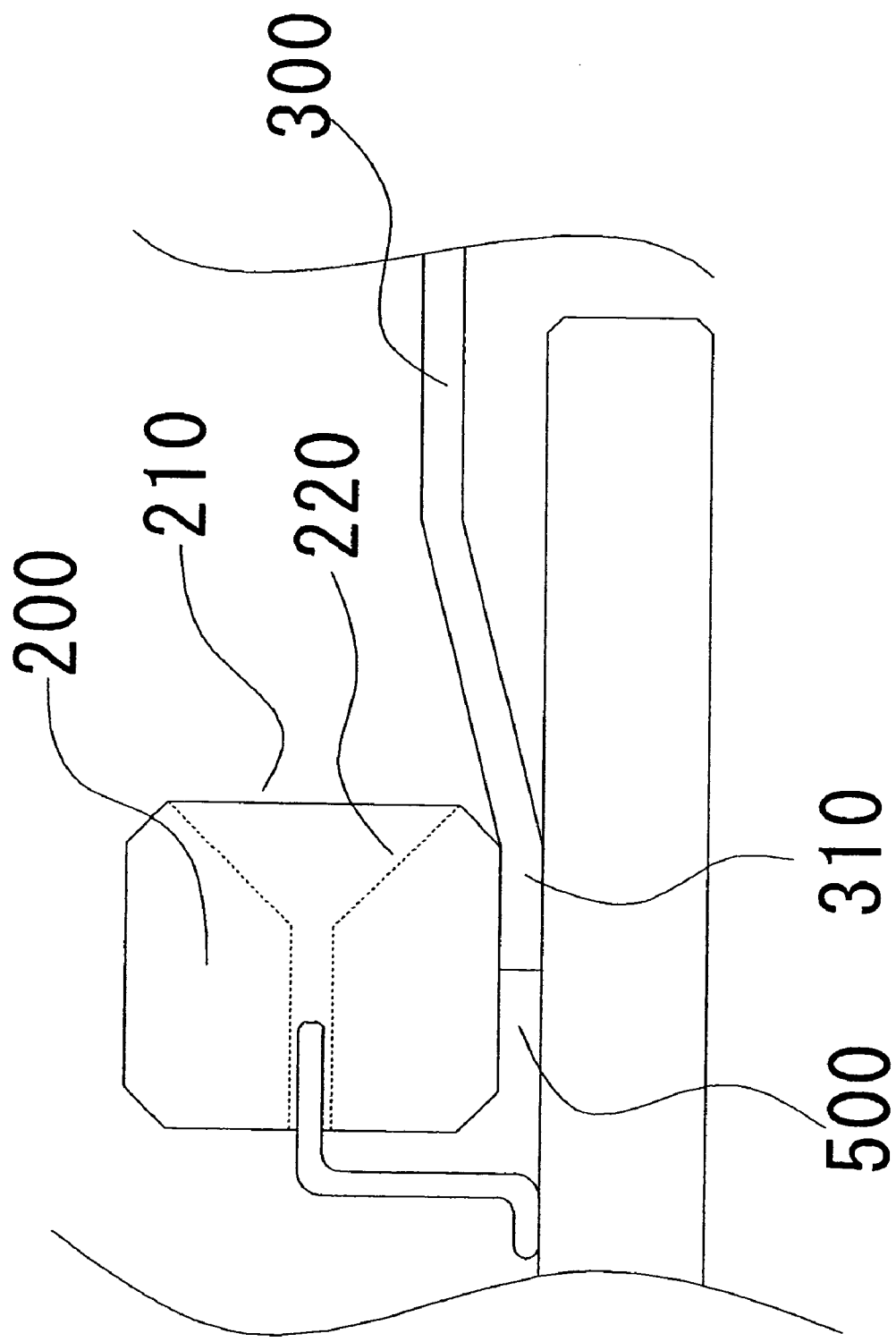
FIG. 4 is a view schematically showing a structure in the prior art.

FIG. 3 is a view schematically showing a third preferred embodiment according to the invention. FIG. 3 shows a recording disk drive device.

Examples of typical electronic equipment include a recording disk drive device. A recording disk drive device comprises a main circuit board 21, an electric motor 7 for rotating a recording disk, and a head unit, not shown, including a recording head for recording information on the recording disk and a reading head for reading the information, neither shown, and a circuit for transferring the information to the recording or reading head or converting the information.

The recording disk drive device includes various connecting terminals such as a power source terminal for supplying electric power from an outside power source, an information terminal for transmitting the information between the recording disk drive device and the outside, and another information terminal for transmitting the information between the head unit and the main circuit board. The head unit need be moved in the radial direction of the recording disk, so that an FPC or an FFC having flexibility need be used in connecting the head unit and the main circuit board to each other. Moreover, since the recording disk drive device is reduced in size in consideration of portability and saved in energy, a thin circuit board for use in connection also becomes thinner. In addition, a connector or the main circuit board also is more reduced in size, and therefore, a complicated structure cannot be provided in order to prevent any erroneous insertion of the thin circuit board. In contrast, it becomes more difficult to insert the thin circuit board into the connector as the size becomes smaller, thereby increasing a possibility of erroneous insertion.

In the present preferred embodiment, the main circuit board 21 is commonly used as a board for the electric motor 7 for rotating the recording disk. Connectors 22a and 22b are mounted at a mounting surface of the main circuit board. One connector 22a is adapted to be connected to the head unit: in contrast, the other connector 22b is disposed for transmitting the information to equipment having the recording disk drive device mounted thereon and supplying the electric power to the recording disk drive device. The shape of each of the connectors 22a and 22b and a thin circuit board 23 are the same as those described in the first preferred embodiment. Here, the shape of each of the connectors 22a and 22b can be appropriately varied in accordance with equipment to be fixed or the thin circuit board 23 to be used.

In the present preferred embodiment, in order to prevent any intrusion of the thin circuit board 23 into a gap 5, a guide 6 is formed on the main circuit board 21 rightward of the connector 22b. The guide 6 is a so-called land formed by applying solder. Incidentally, the guide 6 may be formed by applying a resin or an adhesive agent or a coating material.

There can be provided a connecting terminal, which is reduced in size and is excellent in portability, and therefore, is suitable for the recording disk drive device by applying the invention to the recording disk drive device.

Other Preferred Embodiments

Preferred embodiments according to the invention are not limited to the above-described preferred embodiments, and therefore, various modifications and alterations can be carried out within a range without departing from the spirit and the scope of the invention. For example, the invention is more effective in the case where an FFC or the like even thinner than the FPC is used in place of the FPC. A circuit board not having flexibility may be used in place of the FPC. Furthermore, a terminal formed integrally with the connector may be fixed to the main circuit board by soldering. Since the fixture by the soldering is very strong, it is possible to reduce a fear of falling-down and breakage of the connector in the case where force is liable to be exerted on the connector. Additionally, a groove, in which the adhesive agent is reserved, is formed on the circuit board, and the adhesive agent may be applied onto the circuit board by reserving the adhesive agent in the groove, thereby forming the guide. In this case, a resin may be used in place of the adhesive agent.

Moreover, the recording disk drive device can be applied to optical disks such as a CD-ROM, a CD-R, a CD-RW, a DVD-ROM and a DVD-RAM and other optical, magnetic and magneto-optical disk drive devices. Furthermore, the invention can be applied to the case where a board for the electric motor for rotating the recording disk and the main circuit board are different from each other, and therefore, are connected via an FPC.

What is claimed is:

1. Electric equipment comprising:
   a main circuit board having a mounting surface on either one face or both faces thereof;
   a thin circuit board;
   a connector, mounted on the surface, having a inserting port extending in parallel to the surface, the inserting port into which the thin circuit board can be inserted in parallel to the surface from one direction; and
   a guide being formed in the vicinity of the connector on the surface, having a top protruding from the surface and positioned so as to contact to the thin circuit board by the top when the thin circuit board is inserted into the inserting port, the top being equal or closer to the surface than the inserting port.

2. Electric equipment according to claim 1, wherein a height obtained by adding the thickness of the thin circuit board and the height of the guide measured from the mounting surface, is greater than a gap formed between the connector and the surface.

3. Electric equipment according to claim 1, wherein a gap formed between the connector and the surface is sealed with a resin at least on a lower side of the inserting port.

4. Electric equipment according to claim 1, wherein a gap formed between the connector and the surface is sealed with a adhesive at least on a lower side of the inserting port.

5. Electric equipment according to claim 1, wherein the guide is formed by applying one or more materials selected from solder, a resin and a coating material on the main circuit board in a fluid state, followed by solidification.

6. Electric equipment according to claim 5, wherein a height obtained by adding the thickness of the thin circuit board to the height of the guide, which uses the surface as a reference surface, is greater than a gap formed between the connector and the surface.

* * * * *